US008170075B1

(12) United States Patent
Borschowa

(10) Patent No.: US 8,170,075 B1
(45) Date of Patent: *May 1, 2012

(54) METHOD AND APPARATUS FOR DRIVING LASER DIODES

(75) Inventor: Lawrence A. Borschowa, Woodinville, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/876,812

(22) Filed: Sep. 7, 2010

Related U.S. Application Data

(62) Division of application No. 11/165,676, filed on Jun. 24, 2005, now Pat. No. 7,792,166.

(51) Int. Cl.
*H01S 3/00* (2006.01)

(52) U.S. Cl. ............... 372/38.04; 372/38.02; 372/38.07; 323/283

(58) Field of Classification Search ............... 372/38.04; 323/283
See application file for complete search history.

(56) References Cited

U.S. PATENT DOCUMENTS

| 4,509,156 | A | 4/1985 | Ohara et al. |
|---|---|---|---|
| H322 | H | 8/1987 | Simons |
| 4,695,994 | A | 9/1987 | Steenbergen et al. |
| 4,799,224 | A | 1/1989 | Bottacchi et al. |
| 4,817,098 | A | 3/1989 | Horikawa |
| 4,837,428 | A | 6/1989 | Takagi et al. |
| 4,918,681 | A | 4/1990 | Ikeda |
| 5,122,728 | A * | 6/1992 | Ashley .......................... 323/282 |
| 5,414,341 | A * | 5/1995 | Brown .......................... 323/268 |
| 5,444,728 | A | 8/1995 | Thompson |
| 5,604,757 | A | 2/1997 | Liang et al. |
| 5,926,495 | A | 7/1999 | Guch, Jr. |
| 5,946,202 | A | 8/1999 | Ballough |
| 7,792,166 | B2 * | 9/2010 | Borschowa ................ 372/38.04 |

FOREIGN PATENT DOCUMENTS

EP   0759654 AI   2/1997
GB   2 025 121 A   1/1980

\* cited by examiner

*Primary Examiner* — Jessica Stultz
*Assistant Examiner* — Xnning Niu
(74) *Attorney, Agent, or Firm* — Charles A. Lemaire; Lemaire Patent Law Firm, P.L.L.C.

(57) ABSTRACT

Apparatus and method for driving laser diodes with electrical power in pulsed operation. Pulsed power, for example using pulse-width modulation, is applied through an inductor in one or more parallel regulator circuits having little or no output capacitance to provide a high-efficiency laser-diode-driver power supply. Some embodiments that use two or more parallel regulator circuits in the laser-diode driver, drive each from a different phase of a clock signal. Some embodiments provide a first DC-to-DC converter has a relatively high-voltage input (e.g., about 275 volts, 0.75 amps) and an intermediate output of, e.g., 11 to 15 volts, 15 to 11 amps used to charge a storage capacitor, and a second DC-to-DC converter diode driver having one or more parallel circuits (each having, e.g., a PWM switching-mode controller and its respective switch, inductor, and diode) to turn on, regulate, and turn off a constant laser-diode current through one or more laser diodes.

20 Claims, 9 Drawing Sheets

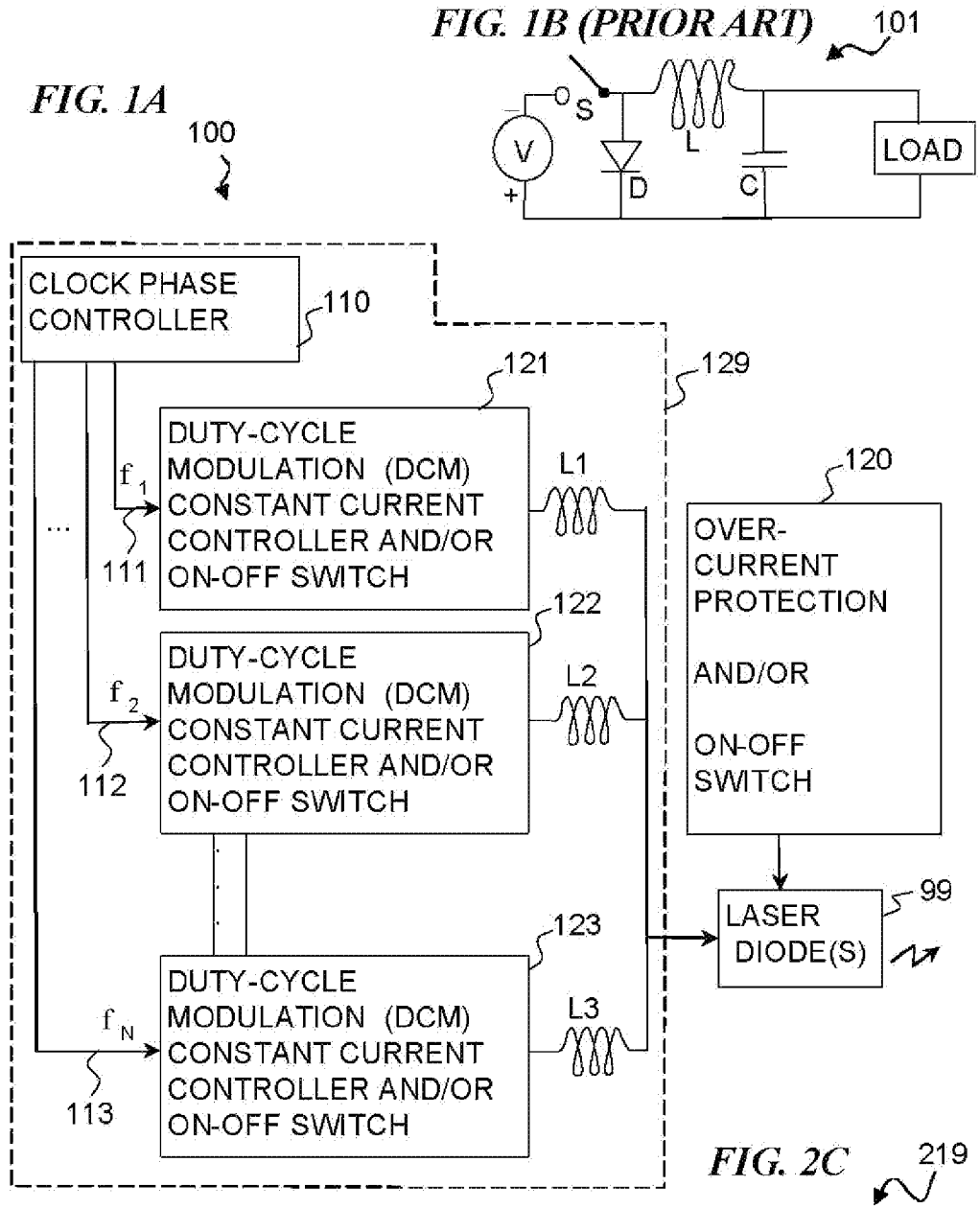
FIG. 1A
FIG. 1B (PRIOR ART)
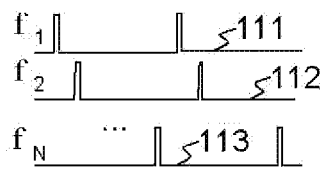
FIG. 2A
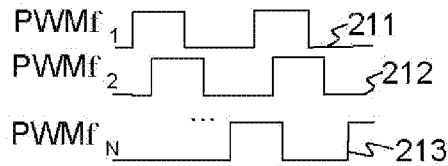
FIG. 2B
FIG. 2C

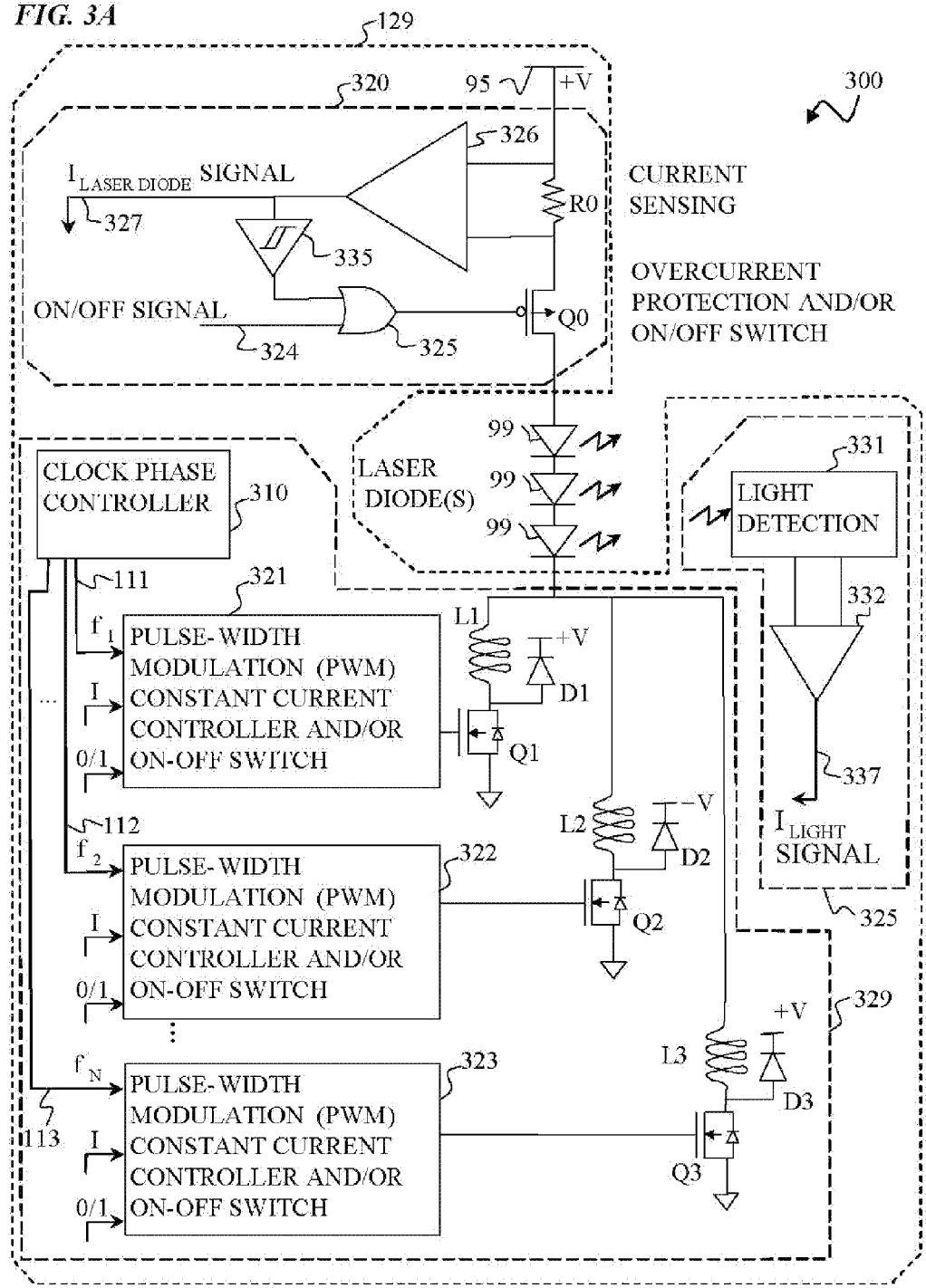

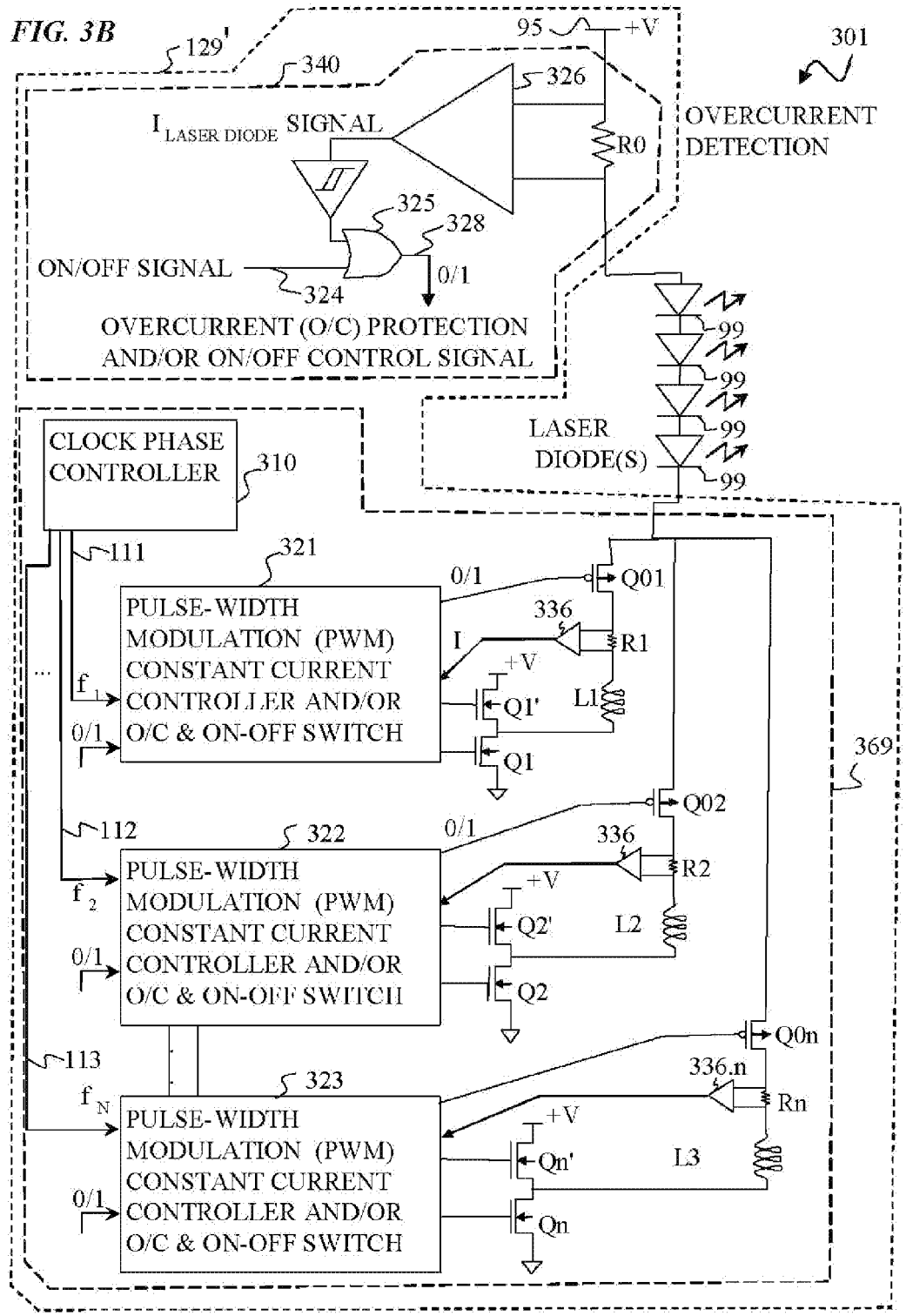

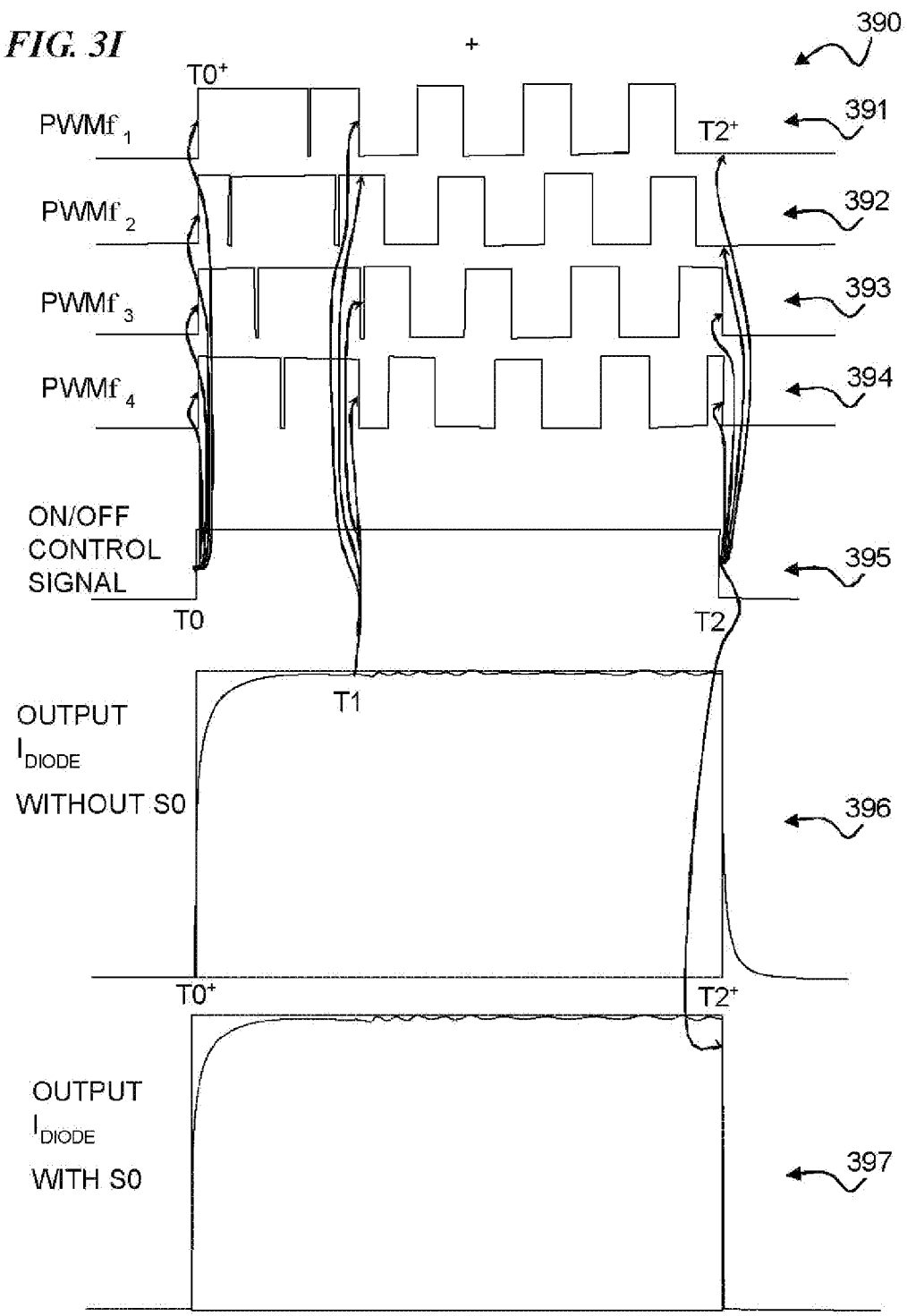

METHOD AND APPARATUS FOR DRIVING LASER DIODES

CROSS-REFERENCE TO RELATED APPLICATIONS

This is a divisional of U.S. patent application Ser. No. 11/165,676 titled "APPARATUS AND METHOD FOR DRIVING LASER DIODES" filed on Jun. 24, 2005 (which issued as U.S. Pat. No. 7,792,166 on Sep. 7, 2010), which is hereby incorporated by reference in its entirety.

FIELD OF THE INVENTION

The present invention relates to electrical power supplies and more particularly apparatus and method for driving laser diodes with electrical power.

BACKGROUND OF THE INVENTION

High-power laser diodes require relatively high current at relatively low voltages. Laser diodes tend to have not only the non-linear impedance characteristics of a semiconductor diode, but also require a large threshold current to initiate and sustain lasing. However, laser diodes are sensitive to overcurrent conditions. In pulsed laser-diode operation, a power supply having a large capacitance at its output has a possibility of delivering undesirable excessive current when initially connected to a laser diode, resulting in catastrophic damage to the laser diode. If a series-pass regulator is used to limit current or voltage, a large voltage drop can develop across the regulator, resulting in inefficient power usage.

Some traditional methods of making constant-current drivers provide a variable-voltage supply that can be adjusted using a control circuit to hold the output current constant. This method works reasonably well for constant-impedance DC loads (such as resistors) and for applications that do not require fast rise time. Typical power-supply circuits of this type provide a voltage supply and typically have significant output capacitance. The load cannot be switched on with a fast rise time since the power-supply circuit must charge the output capacitance. If the load (such as a laser diode) is ever momentarily disconnected during operation, the control circuit, which continues to supply current, will overcharge the output capacitor. When the load then reconnects, the inevitable current surge available from the discharge of the output capacitor, and possibly additional current from the control circuit, will most likely destroy a laser diode.

Another conventional current-source circuit topology is a voltage supply with a series-pass linear current regulator. Typical power-supply circuits of this type can provide fast rise times and can have little or no significant output capacitance. One penalty is that the series-pass regulator will typically require a 2- to 6-volt drop (or more) across the regulator itself to act as an effective regulator. Power-transfer efficiencies of this circuit thus can be very poor.

What is needed is a high-efficiency power supply capable of selectively delivering large well-regulated currents at low voltages. Also needed, in some embodiments, is the ability to specify a desired current level, the ability to change the current level, and/or the ability to turn the current on and off quickly.

SUMMARY OF THE INVENTION

The present invention provides a high-efficiency switching power supply to supply DC power to laser diodes. In some embodiments, a constant-current power supply is provided that selectively and intermittently provides high current (e.g., up to about one hundred amps or more, in some embodiments) periodically (i.e., in some embodiments, as a pulsed square wave having successive power "on" and power "off" periods of time selected for the desired system requirements). In some embodiments, little or no output capacitance is used, in order to avoid high current surges when power is initially applied to the laser diode. In some embodiments, an output circuit having one or more buck-type circuit switched inductors (in some embodiments, if a plurality of such buck circuits are used, each is driven at a different phase or time delay relative to a primary clock source in order to further reduce output ripple).

The new circuit and method described here has advantages over the conventional solutions described above. This new topology provides fast rise time, high efficiency, and has little or no output capacitance (except for, optionally, a very small capacitance to shunt RF noise). In some embodiments, the circuit provided includes a multiphase pulse-width-modulated switching buck converter. One unique feature of this design is that the inductor component of the pulse-width modulator is also the output filter. The pulse-width modulator is driven to provide a controlled output current, not a controlled voltage. In some embodiments, if more than one phase is used, the phases are driven with a synchronous clock such that the combined ripple currents from each phase average (each parallel circuit provides current with smaller ripple, and the ripple peaks and valleys are shifted in phase to one another).

Some embodiments of the new circuit have one or more of the following advantages:
  Fast rise time can be achieved. Rise time can be chosen as a design trade-off of inductor value, switching frequency, input supply voltage, output ripple current, and the number of phases used.
  There is substantially no stored electrical energy in the output since there is little or no output capacitance. Accordingly, a momentary open circuit does not cause a current spike when the load reconnects.
  An instantaneous step in the load's impedance causes only a minor perturbation in output current.
  Efficiency can be high since there is no series-mode linear regulator in the output.
  Output cable inductance does not cause ringing or overshoot in the load, but acts as additional filtering to reduce ripple current.
  The load can be driven pulsed or DC with the same circuit (within constraints of available power).

In some embodiments, two or more DC-to-DC converters are used in series. For example, in some embodiments, a first switching-mode DC-to-DC converter (e.g., the one driving the laser diodes or other load elements) has an intermediate-voltage moderate current input (e.g., the 15 to 11 volts at 11 to 15 amps output of a second DC-to-DC converter plus the current from the charged storage capacitor—see FIG. 4, for example) and an output of 3.6 to 4.5 volts (per laser diode if the laser diodes are wired in series) at up to 100 amps or more (e.g., a constant current of 70 amps regardless of diode voltage, in some embodiments) that is used to drive the laser diode. In some embodiments, the second switching-mode DC-to-DC converter has a relatively high-voltage low-current input (e.g., 270 volts at 0.73 amps) and an intermediate output of 11 to 15 volts at 15 to 11 amps that is used to charge a suitably-sized storage capacitor, and the output of the second DC-to-DC converter is output-voltage limited to not exceed 15 volts, and is output-current limited to supply a maximum current $I_{max} \leq C_1+C_2(V_{max}-V_{out})$. The constants $C_1$ and $C_2$ are chosen to limit the maximum power drawn from the prime power supply, while nearly maximizing the current available to recharge the storage capacitor.

BRIEF DESCRIPTION OF THE DRAWINGS

FIG. 1A is a block diagram of a system 100 representing one embodiment of the present invention having a switching power supply 129 that provides electrical power to a laser diode 99.

FIG. 1B is a block diagram of a prior-art switching power supply 101 that provides electrical power to a load.

FIG. 2A is a timing diagram of clock pulse trains 111, 112, and 113.

FIG. 2B is a timing diagram of PWM pulse trains 211, 212, and 213.

FIG. 2C is a timing diagram 219 showing ripple reduction.

FIG. 3A is a block diagram/schematic of a system 300 representing one embodiment of the present invention having a switching power supply 129 that provides electrical power from one or more transistor-diode-inductor regulator supplies to one or more laser diodes 99.

FIG. 3B is a block diagram/schematic of a system 301 representing one embodiment of the present invention having a switching power supply 129 that provides electrical power from one or more transistor-transistor-inductor regulator supplies to one or more laser diodes 99.

FIG. 3I is a timing diagram schematically showing representative signals of a four-phase regulator as it turns the laser-diode current on and off.

DESCRIPTION OF EMBODIMENTS

Figure 3C:
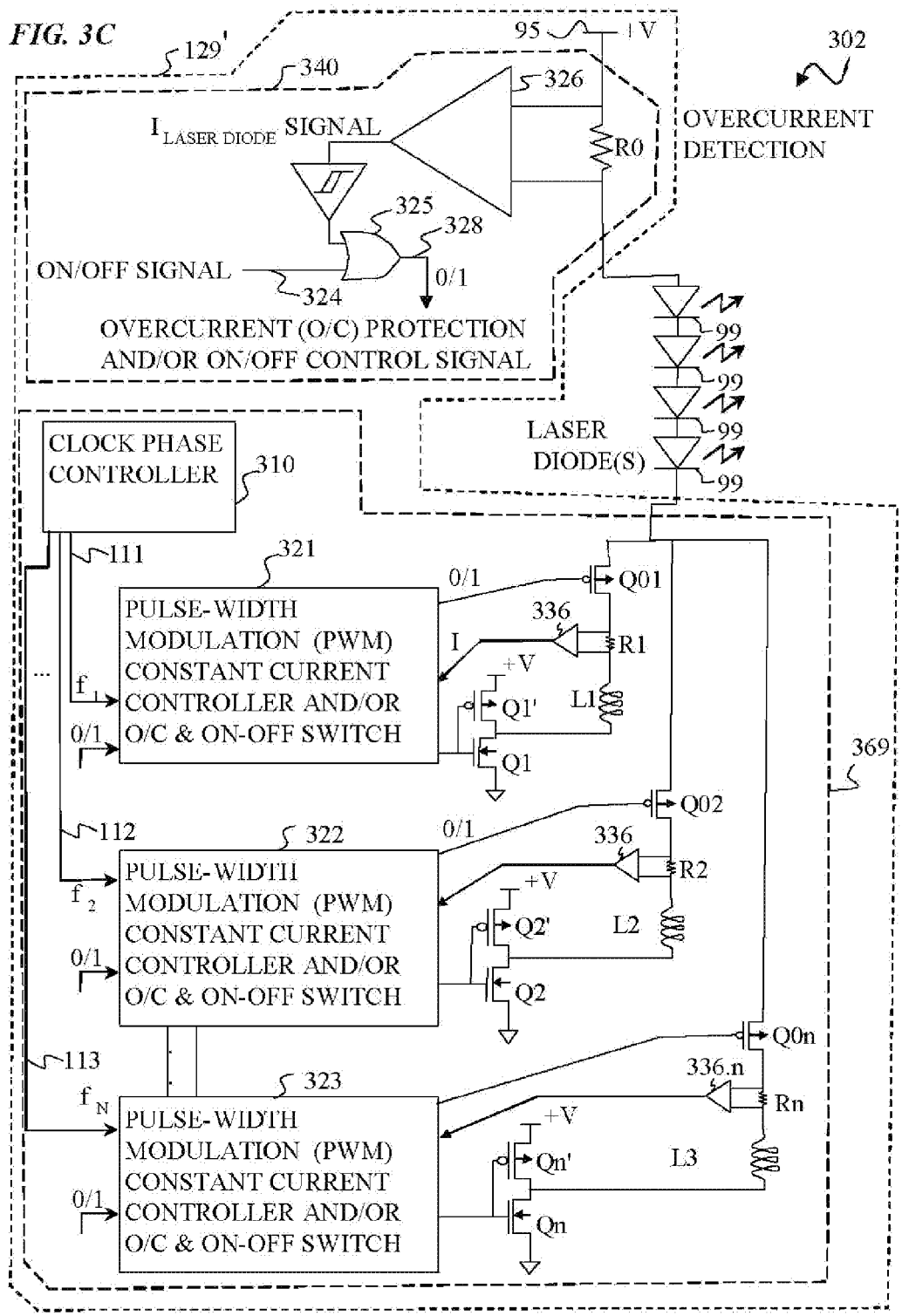
FIG. 3C is a block diagram/schematic of a system 302 representing one embodiment of the present invention having a switching power supply 129 that provides electrical power from one or more transistor-transistor-inductor regulator supplies to one or more laser diodes 99.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

The present invention provides a high-efficiency switching power supply to supply DC power to laser diodes. In some embodiments, a constant-current power supply is provided that selectively and intermittently provides high current (e.g., one hundred amps, in some embodiments, or in other embodiments, about 10 amps, about 20 amps, about 30 amps, about 40 amps, about 50 amps, about 60 amps, about 70 amps, about 80 amps, about 90 amps, about one hundred amps, about 110 amps, about 120 amps, about 130 amps, about 140 amps, about 150 amps, about 160 amps, about 170 amps, about 180 amps, about 190 amps, about 200 amps, about 210 amps, about 220 amps, about 230 amps, about 240 amps, about 250 amps, about 260 amps, about 270 amps, about 280 amps, about 290 amps, about 300 amps, about 310 amps, about 320 amps, about 330 amps, about 340 amps, about 350 amps, about 360 amps, about 370 amps, about 380 amps, about 390 amps, about 400 amps, about 410 amps, about 420 amps, about 430 amps, about 440 amps, about 450 amps, about 460 amps, about 470 amps, about 480 amps, about 490 amps, about 500 amps, or more than 500 amps, or within ranges between pairs of the before mentioned current values) periodically. For example, in some embodiments, power is "on" for about ten seconds and "off" for about thirty seconds, with a total period of about forty seconds. In other embodiments, the "on" time is about 1, 2, 3, 4, 5, 6, 7, 8, 9, 11, 12, 13, 14, 15, 16, 17, 18, 19, or 20 seconds or more than 20 seconds for the power "on" portion. In some embodiments, the power is switched on and held at a controlled predetermined current level (or at two or more different controlled current levels during consecutive subperiods) for an amount of time in a range between any pair of the above "on" times. In these various embodiments, the power is then switched "off" for about 1, 2, 4, 6, 8, 10, 12, 14, 16, 18, 20, 22, 24, 26, 28, 32, 34, 36, 38, 40, 42, 44, 46, 48, or 50 seconds, or more than 50 seconds for the power "off" portion. In some embodiments, the power is switched off for an amount of time in a range between any pair of the above "off" times. In some embodiments, little or no output capacitance is used, in order to avoid high current surges when power is initially applied to the laser diode. In some embodiments, an output circuit having one or more buck-type circuit switched inductors (in some embodiments, if a plurality of such buck circuits are used, each is driven at a different phase or time delay relative to a primary clock source in order to further reduce output ripple).

FIG. 1A is a block diagram of a system 100 representing one embodiment of the present invention having a switching power supply 129 that provides electrical power to, for example, a laser diode 99. In some embodiments, the present invention provides a high-efficiency switching power supply to supply DC power to laser diodes. In some embodiments, a constant-current power supply 129 is provided that selectively and intermittently provides high current periodically. In some embodiments, little or no output capacitance is used, in order to avoid high current surges when power is initially applied to the laser diode, or surges that may occur if the laser diode is temporarily disconnected and is then reconnected. In some embodiments, the output circuit of switching power supply 129 includes one or more buck-type switched inductors 121 and L1, 122 and L2, ... 123 and L3 and the like, each of which repeatedly connects and then disconnects (switches) a voltage to its series inductor to provide a current to the load, laser diode 99. In some embodiments, this switching uses duty-cycle modulation (DCM) from each of the one or more circuits 121 through 123, in which the pulse width, frequency, or both of a pulse train of rectangular pulses is varied to establish, maintain, vary, and/or turn on and off some parameter (e.g., to maintain a constant current through laser diode 99 (or, in other embodiments, to maintain constant light output from laser diode 99) for selected periods of time). In some embodiments, if a plurality of such buck circuits are used (e.g., two, three, four, or other multiple of circuit 121 and inductor L1), each circuit 121 through 123 is driven at a different phase or time delay relative to a primary clock source 110, in order to further reduce output ripple, as compared to the current ripple obtained from a single DCM-inductor circuit used to supply all the required current. In some embodiments, diode symbol 99 in FIG. 1A represents a plurality of laser diodes wired in parallel, in series, or in parallel-and-series, and all driven by the one or more duty-cycle modulation (DCM)-inductor circuits 121-123 and L1-L3 used to supply all the required current.

Although some embodiments described herein describe use of pulse-width modulation (PWM, which is one type of DCM), it is to be understood that other embodiments that are otherwise substantially identical, substitute frequency modulation, or use both frequency and pulse-width modulation, or use other forms of duty-cycle modulation. One advantage of using PWM is that the different phases can be set from a given source clock by simple time-delay circuits or by digital divide-by-N circuits well known in the art, combined with logical circuits (i.e., NAND gates). Further, using PWM from a fixed-frequency synchronized clock can simplify filter design (such as the choice of inductor size) needed to reduce ripple. In some embodiments, frequency modulation control circuits can also use digital divide-by-N circuits well known in the art, combined with logical circuits (e.g., NAND gates) to provide suitably distributed phases.

In some embodiments, a common clock controller 110 is used to provide synchronized clock pulses of any suitable duration and each having a different phase than the others. In other embodiments, different suitable time delays relative to a single-phase clock signal are produced internally to each DCM controller 121-123. In some embodiments, the different phases and/or time delays are spread evenly across each clock cycle time, in order to minimize constructive interference (i.e., adding of ripple) in the electrical current supplied by circuit 129.

In some embodiments, at least one of the one or more constant-current controllers 121 through 123 utilizes pulse-width modulation (i.e., varying the width of pulses while maintaining a suitable substantially constant frequency or cycle time, which varies the proportion of "on" time to cycle time=duty cycle) to provide a selected value of constant-current output. In other embodiments, at least one of the one or more constant-current controllers 121 through 123 utilizes frequency modulation (i.e., varying the frequency or cycle time of pulses while maintaining a suitable substantially constant pulse width, which also varies the proportion of "on" time to cycle time=duty cycle) to provide a selected value of constant-current output. In yet other embodiments, at least one of the one or more constant-current controllers 121 through 123 utilizes both pulse-width and frequency modulation (i.e., varying the width of pulses and varying the frequency or cycle time of pulses, which also varies the proportion of "on" time to cycle time=duty cycle) to provide a selected value of constant-current output.

Some embodiments further include optional circuit 120, which provides over-current protection and/or ON-OFF switch function that switches off if it is detected that too much current is flowing, and/or provides ON-OFF control when intermittent operation is desired.

In some embodiments, laser diode current is selectively turned on and off by gating the pulses (i.e., when no pulses turn on any of the switch transistors that apply current to the inductors, then there is no current through the laser diode 99) with AND gates and/or other suitable logic. In some embodiments, by combining the constant current control, optional overcurrent shutoff control, and/or the on-off control and having the combined output driving only one series-connected transistor (even though perhaps including a plurality of parallel transistors) in the laser diode's current path, higher efficiencies can be obtained, since one or more additional series connected transistors would increase the voltage drop across those transistors.

FIG. 1B is a block diagram of a conventional buck-type regulator (also called a forward regulator) switching power supply 101 that provides electrical power to a load. Switch S is toggled open and closed under the control of a control circuit (not shown) to achieve voltage and/or current regulation, as desired. During a first time period, switch S is closed (and diode D is open, i.e., back biased), and current flows through inductor L (building a magnetic field) and into the LOAD and into capacitor C (building an electric field). During a second time period, switch S is open (and diode D is closed, i.e., forward biased), and current flows through inductor L (depleting its magnetic field) and/or from capacitor C (depleting its electric field) and into the LOAD. One problem with a circuit such as 101 is that if it is modified such that the load can be disconnected (e.g., by inserting a switch S0 in series with the load (such as shown in FIG. 3D below) in order to, for example, provide faster rise and fall times during switching the load on and off), then the regulator (i.e., supply voltage V, switch S, diode D, and inductor L) can place a significant charge on the capacitor C while S0 is open. That charge will remain there until, when switch S0 is again closed, capacitor C can provide an unwanted current spike and/or overvoltage condition, which can destroy sensitive loads such as laser diodes.

In some embodiments, the present invention uses one or more similar circuits to circuit 101, except that in some embodiments, the capacitor C is omitted. In some embodiments, the present invention uses two or more similar circuits, wherein the respective switches S of each circuit are each operated at a different time delay or phase of a base clock signal. In some embodiments, the capacitor C is included, but a shorting switch (e.g., a transistor wired to short the two terminals of capacitor C and/or to short the two terminals of the laser diodes when it is desired to have the laser diodes off, in order to discharge any electrical charge on the capacitor (this provides faster turn-off fall times and prevents charge buildup on the capacitor when the laser diodes are disconnected).

FIG. 2A is a timing diagram of clock pulse trains 111, 112, and 113, wherein the respective switches S of each circuit 121, 122 . . . 123 are each operated at a different time delay or phase of a base clock signal.

FIG. 2B is a timing diagram of PWM pulse trains 211, 212, and 213, wherein the respective switches S of each circuit 121, 122 . . . 123 are each operated at a different time delay or phase of a base clock signal. In some embodiments, the widths of each pulse train are modulated in order to maintain a substantially constant current through laser diode 99. In some embodiments, a feedback signal derived from a sensing of the laser diode current is phase, inversion, or time-delay adjusted in order to provide negative feedback that reduces output ripple and to prevent positive feedback of the ripple in the sensed current from being amplified.

FIG. 2C is a conceptual timing diagram 219 (scale in arbitrary units) showing ripple reduction achieved by adding currents of the individual buck-type switched inductors 121 and L1, 122 and L2, . . . 123 and L3 and the like, wherein the currents from each of four such circuits operating on four equally spaced phase delays are added, wherein each of the four circuits provides about one fourth of the total specified laser-diode current. Conceptual timing diagram 219 represents a mid-pulse portion of current or a current pulse, and does not represent the turn-on or turn-off characteristics. In some embodiments, a MOSFET transistor used as an "OFF" switch is wired in series with the laser diode(s) 99 (e.g., see transistor Q0 of FIG. 3A or transistor Q01 of FIG. 3B or transistor Q01 of FIG. 3C or switch S0 of FIG. 3D or switch S01 of FIG. 3E), and, in some embodiments, provides a fall time of the current as fast as 1-2 microseconds or faster. In some embodiments, a MOSFET transistor used as a shorting-type "OFF" switch is wired in parallel with the laser diode(s) 99 (e.g., see switch SS of FIG. 3F or FIG. 3G), and, in some embodiments, also provides a fall time of the current as fast as 1-2 microseconds or faster. Such a shorting-type "OFF" switch is particularly useful in circuits that have a capacitor in parallel with the laser diodes, in order to provide faster fall times when turning the current OFF, and to avoid current spikes into the load from the capacitor when reconnecting the load (turning the current ON).

FIG. 3A is a block diagram/schematic of a system 300 representing one embodiment of the present invention having a switching power supply 129 that provides electrical power from one or more transistor-diode-inductor regulator supplies to one or more laser diodes 99. In the embodiment shown, three laser diodes are wired in series in order that each gets the same current. In other embodiments (not shown), a single laser diode, or laser diodes wired in parallel are used. In some embodiments, a voltage drop through a small resistance R0 is measured by a differential amplifier 326, which measures the total laser-diode current through all of the one or more laser diodes, and whose output $I_{LASER\ DIODE}$ signal 327 is used to adjust the pulse widths of each PWM circuit 321 through 323. In other embodiments, currents through each of the individual resistances R1-R3 in each inductor circuit are measured by respective differential amplifiers 336 (as shown in FIG. 3B), in order that the measurements have an immediate response by the individual PWM circuits.

In some embodiments, if the total measured current as indicated by $I_{LASER\ DIODE}$ signal 327 is sufficiently large (indicating an overcurrent condition) as measured, for example, by Schmidt trigger circuit 335, its signal causes logic circuit 325 to turn off transistor Q0, stopping current through all of the one or more laser diodes 99, preventing more serious damage to the laser diode(s) from the overcurrent. In some embodiments, circuit 325 provides an OR function, wherein if either ON/OFF signal 324 is high or $I_{LASER\ DIODE}$ signal 327 as measured by circuit 335 is high, then the output of circuit 325 will be high and will turn off transistor Q0; otherwise the output of circuit 325 will be low and transistor Q0 will conduct current with a very low (almost negligible) resistance. In some embodiments, transistor Q0 is a power N-channel FET. In other embodiments, transistor Q0 is a power P-channel FET, in order that it may more effectively turn on current and turn off current.

As noted above, other embodiments substitute other types of duty-cycle modulation (DCM) control circuits (as described above) for the PWM circuits 321-323 shown in FIG. 3A.

In some embodiments, each PWM circuit (e.g., circuit 321) provides a control function that provides PWM regulation of its switch transistor (e.g., transistor Q1, corresponding to switch S of FIG. 1B (e.g., a power N-channel MOSFET-type transistor, in some embodiments)), its diode (e.g., diode D1, corresponding to diode D of FIG. 1B), and its inductor (e.g., inductor L1, corresponding to inductor L of FIG. 1B) provide regulation of its respective fraction of the current through laser diode 99. In some embodiments, the capacitance corresponding to capacitor C of FIG. 1B is omitted. In some embodiments, the capacitance corresponding to capacitor C of FIG. 1B is the parasitic capacitance within laser diode 99. In some embodiments, a small-capacitance capacitor corresponding to capacitor C of FIG. 1B is wired in parallel with laser diode 99 to reduce RF noise (e.g., that due to switching of transistor Q1). In some embodiments, the PWM function of circuit 321 is modulated or controlled by $I_{LASER\ DIODE}$ signal 327 as shown in FIG. 3A. In other embodiments, the PWM function of each circuit 321, 322, . . . 323 is modulated or controlled by its own individual current-sensing circuit $I_{LASER\ DIODE}$ signal 327 as shown in FIG. 3A. In some embodiments, circuit 321 generates a pulse train signal to transistor Q1, fully turning on transistor Q1 (i.e., to a very low resistance) when the signal is high (causing current through inductor L1 and the laser diodes 99) and turning transistor Q1 off during the space between pulses. When transistor Q1 switches off, the voltage at the lower end of inductor L1 exceeds V+ and diode D1 conducts, thus continuing current flow through the laser diodes until the magnetic field of the inductor is dissipated and diode D1 turns off. In some embodiments, diode D1 is selected to have a low forward voltage drop (e.g., a Schottky-type diode or the like) and transistor Q1 is selected to have a very low ON-resistance (and thus a low voltage drop), in order to improve power supply efficiency.

In some embodiments, transistors Q2 through Q3 are also power N-channel MOSFET-type transistors, and each is driven by pulse trains representing different phases of a synchronized clock signal.

In some embodiments, only a single PWM circuit 321 is provided (i.e., omitting circuits 322 . . . 323 and their associated transistors Q2 . . . Q3, diodes D2 . . . D3, and inductors L2 . . . L3). In other embodiments, a plurality of PWM circuits 321 . . . 323 are provided, and in some embodiments, each is driven by different phases (e.g., in some embodiments, the phase delay differences are each substantially equal) by clock phase controller 310. In some embodiments, only two PWM circuits 321 and 322 are provided, and in some embodiments, each is driven by two equally spaced phases by clock phase controller 310 (i.e., omitting circuit 323 and its associated transistor Q3, diode D3, and inductor L3). In some embodiments, three PWM circuits 321, 322 and 323 are provided, and in some embodiments, each is driven by three equally spaced phases 111, 112, 113 by clock phase controller 310. In some embodiments, four PWM circuits 321, 322 . . . 323 are provided, and in some embodiments, each is driven by four equally spaced phases 111, 112 . . . 113 by clock phase controller 310. In some such embodiments having four parallel converter stages, when the output is commanded on, all phases of the converter (i.e., Q1-Q3) switch on at up to 100% duty cycle. This charges the four inductors L1-L3 to the commanded current value, providing a fast rise time. When the load current through the laser diode reaches the commanded current value, the control circuit 239 regulates the pulse width modulators 321-323 to maintain the commanded output current value. In some embodiments, the current value is variable and can be commanded to any one of a plurality of different values. In some embodiments, the commanded current value can be adjusted or changed during a single ON cycle (e.g., ramping up or ramping down, or the like).

In some embodiments, five or more PWM circuits 321, 322 . . . 323 are provided, and in some embodiments, each is driven by that number of equally spaced phases 111, 112 . . . 113 by clock phase controller 310. In some embodiments, ON/OFF signal 324 is applied to each circuit 321 . . . 323 (through the input labeled "0/1") to turn off transistors Q1 . . . Q3 during period when the system specifies that no current is to be applied to laser diode 99 (an alternative way to turning off circuit 325 and transistor Q0). In some embodiments, transistor Q0 is omitted, and any overcurrent condition that is detected will cause circuits 321 . . . 323 to shut off transistors Q1 . . . Q3 (thus reducing the voltage drops external to laser diode 99, and improving efficiency). In some embodiments, transistor Q0 is wired such that its source and drain terminals are wired to short the laser diode(s), thus diverting any overcurrent condition around the laser diode(s) (and thus reducing the voltage drops external to laser diode 99, and improving efficiency).

In some embodiments, as an alternative or additional option to measuring current, a light output of laser diode(s) 99 is measured, e.g., by light detection device 331 and differential amplifier 332 to produce $I_{LIGHT}$ signal 337, which is used instead of (or in addition to) $I_{LASER\ DIODE}$ signal 327 to modulate the PWM function (or DCM function) of circuit(s) 321-323. In some embodiments, $I_{LIGHT}$ signal 337 is indicative of the current through laser diode(s) 99, and the control provided by $I_{LASER\ DIODE}$ signal 327 allows circuits 321-323 to control current in order to provide a constant laser light output.

FIG. 3B is a block diagram/schematic of a system 301 representing one embodiment of the present invention having a switching power supply 129 that provides electrical power from one or more transistor-transistor-inductor regulator supplies to one or more laser diodes 99. The circuit of system 301 operates in much the same manner as the circuit of system 300 described above, except transistor Q0 is omitted and its function is included in circuit 321 and its control of transistors Q1 and Q1', which, in some embodiments, are both N-channel MOSFETs (e.g., in some embodiments, Q1 is an N-channel transistor that turns on if its gate voltage is high as compared to the ground voltage, and Q1' is an N-channel transistor that turns on if its gate voltage is high as compared to the +V voltage (the voltage on the node between Q1' and L1 will be higher than the +V voltage during the time Q1' conducts); transistors Q2 and Q2' through Q3 and Q3' operate in a corresponding manner but with a phase delay). In some embodiments, series-wired transistors QO1 through QOn are also provided to turn off current from each of the individual one or more transistor-transistor-inductor regulator supplies.

The individual one or more transistor-transistor-inductor regulator supplies operate as follows: when the signal to the gates of transistors Q1 and Q1' from circuit 321 goes high, transistor Q1 turns on and current flows through the laser diodes 99 and inductor L1 to ground. When the signal from circuit 321 goes low, transistor Q1 turns off, transistor Q1' turns on (replacing the function of diode D1 of the circuit of system 300 described above) and current flows through the laser diodes 99 and inductor L1 to V+ until the magnetic field of inductor L1 dissipates. Transistor Q1' acts as a synchronous rectifier, in that it has low resistance when transistor Q1 turns of and the voltage at the lower end of inductor L1 is higher than V+, however, in some embodiments, such a MOSFET transistor has a lower voltage drop when turned on than does diode D1 described above in FIG. 3A, thus further increasing the efficiency of the power-supply circuit 129' in system 301 as compared to power-supply circuit 129 in system 300 described above.

In some embodiments, as an alternative or additional option to measuring current, a light output of laser diode(s) 99 is measured, e.g., by a light-detection device 331 and differential amplifier 332 to produce $I_{LIGHT}$ signal 337 (as shown in FIG. 3A), which is used instead of (or in addition to) $I_{LASER\ DIODE}$ signal 327 to modulate the PWM function (or DCM function) of circuit(s) 321-323. In some embodiments, $I_{LIGHT}$ signal 337 is indicative of the current through laser diode(s) 99, and the control provided by $I_{LASER\ DIODE}$ signal 327 allows circuits 321-323 to control current in order to provide a constant laser light output.

Figure 3D:
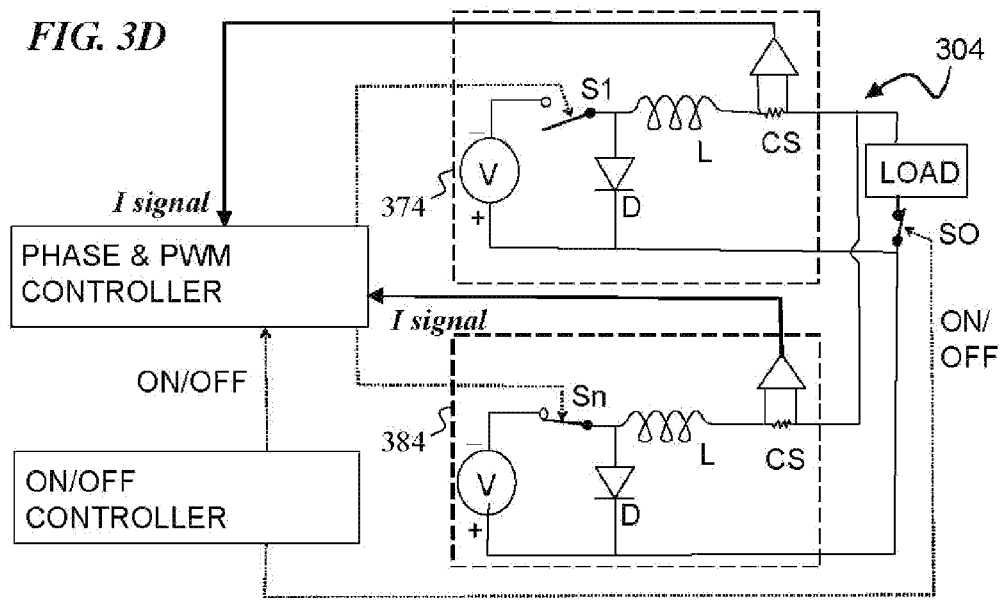
FIG. 3D is a block diagram of system 304 that provides electrical power from one or more transistor-diode-inductor regulator supplies to one or more laser diodes 99.

FIG. 3C is a block diagram/schematic of a system 302 representing one embodiment of the present invention having a switching power supply 129 that provides electrical power from one or more transistor-transistor-inductor regulator supplies to one or more laser diodes 99. The circuit of system 302 operates in much the same manner as the circuit of system 301 described above, except that in system 302 transistors Q1 and Q1' are complementary MOSFETs (e.g., in some embodiments, Q1 is an N-channel transistor that turns on if its gate voltage is high as compared to the ground voltage, and Q1' is an P-channel transistor that turns on if its gate voltage is low compared to the voltage on the node between Q1' and L1 (the voltage on the node between Q1' and L1 will be higher than the +V voltage during the time Q1' conducts); transistors Q2 and Q2' through Q3 and Q3' operate in a corresponding manner but with a phase delay).

FIG. 3D is a block diagram of system 304 that provides electrical power from one or more transistor-diode-inductor regulator supplies to one or more laser diodes 99. In the circuit of system 304, the individual transistor-diode-inductor regulator supplies (in the embodiment shown, there are two: supply 374 and supply 384) are each supplied from a voltage source (which can be capacitive and can vary in voltage as long as the voltage remains higher than the voltage across the load). A current sensor CS in each individual transistor-diode-inductor regulator supply measures that circuits current and provides individual signals I signal to control its PWM controller in order to maintain a constant current equal to a specified (desired) current. In some embodiments, the specified current can be varied. In some embodiments, the PHASE AND PWM CONTROLLER includes microprocessor control that accepts a current value to be specified and stored. In some embodiments, a single switch SO (which can be one or more MOSFETs (e.g., wired in parallel if two or more) is provided to turn off current through the laser diodes or other load.

Figure 3E:
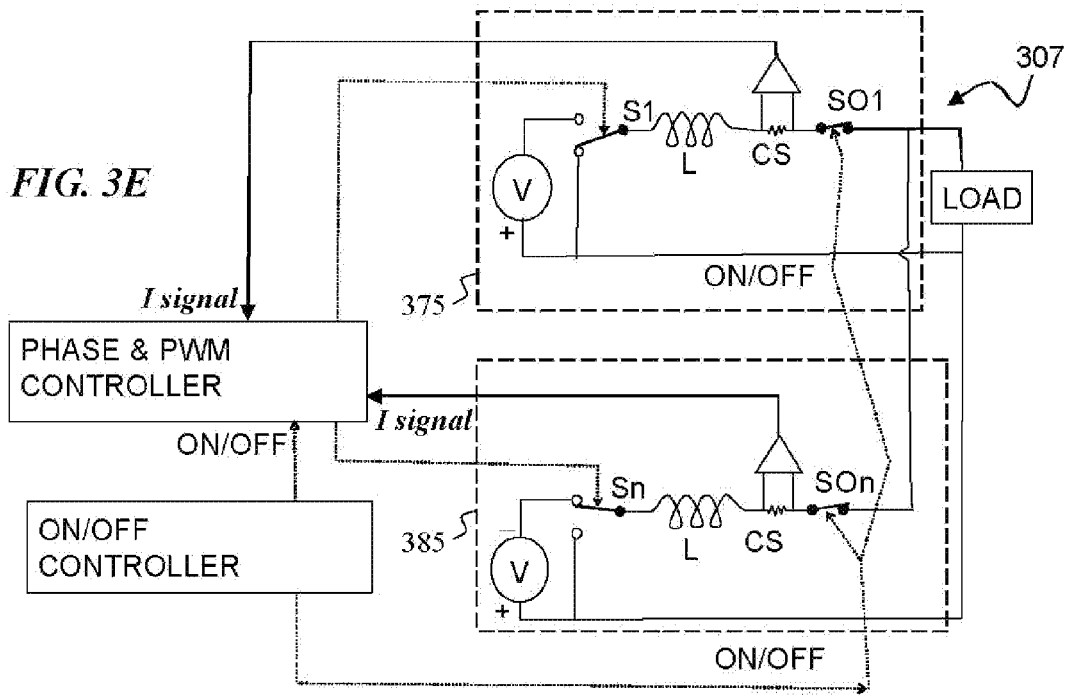
FIG. 3E is a block diagram of a system 305 that provides electrical power from one or more transistor-transistor-inductor regulator supplies to one or more laser diodes 99.

FIG. 3E is a block diagram of a system 305 that provides electrical power from one or more transistor-transistor-inductor regulator supplies to one or more laser diodes 99. The circuit of system 305 is similar to the circuit of system 304. except that a single-pole double-throw switch (each of switches S1 through Sn, e.g., in some embodiments, each switch is implemented by a pair of N-channel FETs, such as Q1 and Q1' as shown in FIG. 3B or by a pair of MOSFETs, such as complementary MOSFETs Q1 and Q1' as shown in FIG. 3C) in circuits 375 and 385 replaces the single-pole single-throw switch and diode of circuit 374 and 384. In some embodiments, the shut-off switch SO in series with the load is replaced by individual shut-off switches in series within each of the circuits 375 and 385.

Figure 3F:
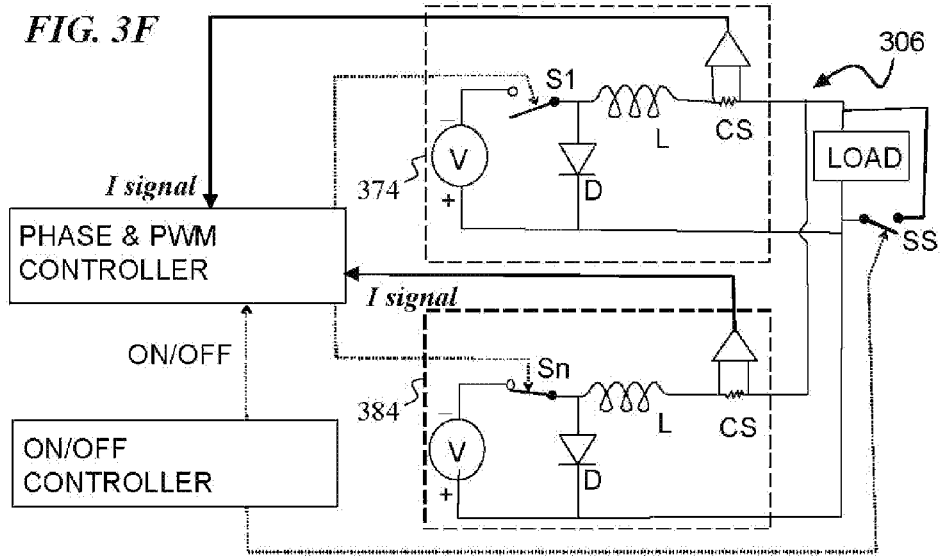
FIG. 3F is a block diagram of a system 306 that provides electrical power from one or more transistor-diode-inductor regulator supplies to one or more laser diodes 99.

FIG. 3F is a block diagram of a system 306 that provides electrical power from one or more transistor-transistor-inductor regulator supplies to one or more laser diodes 99. The circuit of system 306 is substantially similar to the circuit of system 304 of FIG. 3D, except that the serially wired shut-off switch SO of circuit 304 is replaced by a shorting switch SS wired in parallel in the circuit of system 306.

Figure 3G:
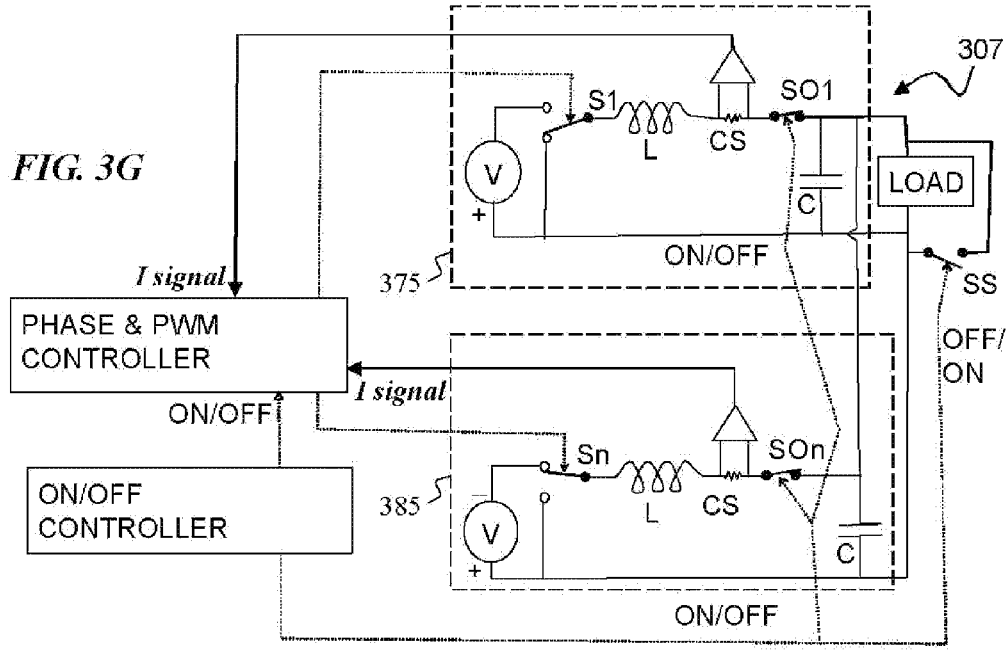
FIG. 3G is a block diagram of a system 307 that provides electrical power from one or more transistor-transistor-inductor regulator supplies to one or more laser diodes 99.

FIG. 3G is a block diagram of a system 307 that provides electrical power from one or more transistor-transistor-inductor regulator supplies to one or more laser diodes 99. The circuit of system 307 is substantially similar to the circuit of system 305 of FIG. 3E, except that shorting switch SS wired in parallel with the load has been added in the circuit of system 306, and one or more capacitors C are wired in parallel to the load. In some embodiments, the switches SO1 through SOn disconnect the regulated current source from the load and the capacitors, in order to prevent the capacitors from charging (i.e., charging to a too-high voltage) during periods when the load is OFF. Shorting switch SS provides a bypass path that shunts substantially all the current around the load (i.e., in some embodiments, shorting switch SS (which is "ON" when it conducts current between its drain and source terminals due to suitable voltage being applied to its gate terminal) has a lower ON or saturation voltage than the ON voltage of the laser diode load such that enough of the load current is diverted through shorting switch SS. Shorting switch SS also discharges any charge remaining on the capacitors C when the laser diode is not being driven. In some embodiments, a MOSFET transistor SS used as a shorting-type switch (when this transistor is "ON" the laser diodes are "OFF") is wired in parallel with the laser diode(s) 99 and, in some embodiments, provides a fall time of the current as fast as 1-2 microseconds or faster. Such a shorting-type "OFF" switch is particularly useful in circuits that have one or more capacitors wired in parallel with the laser diodes, in order to provide faster fall times when turning the current OFF, and to avoid current spikes into the load from the capacitor when reconnecting the load (turning the current ON). In other embodiments, an opening SO type switch.

Figure 3H:
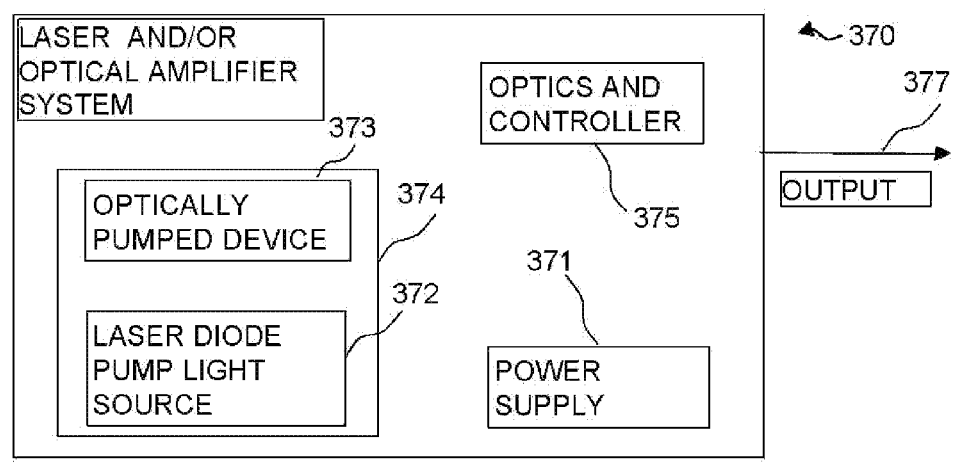
FIG. 3H is a schematic block diagram of an optical system 370.

FIG. 3H is a schematic block diagram of an optical system 370 according to some embodiments of the present invention. In some embodiments, system 370 includes a signal-wavelength amplification system 374 (that, in some embodiments, includes a laser-feedback mechanism such as mirrors or looped fiber to form an optical oscillator or laser, or, in other embodiments, includes an optical input port that obtains laser light from an external source) that includes optically pumped gain device 373 that provides gain to the laser signal light, and a pump laser system 372 that provides pump light to suppressed-cladding-mode gain stage 373. One or more power-supply systems 371 provide electrical power to run various components in system 370 (e.g., controllable electrical power for the laser diodes 372 that provide pump light). In various embodiments of system 370, the one or more power-supply systems 371 are implemented by any of the power supply circuits described above in this specification. Signal-wavelength amplification system 374 outputs signal-wavelength laser light. In some embodiments, optically pumped gain device 373 provides the gain stage within the laser feedback mirrors or other feedback optics and is thus forms a signal laser. In other embodiments, optically pumped gain device 373 is an amplification stage that follows laser signal generation (not shown) elsewhere within system 370. In other embodiments, system 370 receives signal laser light from an external source (not shown) and includes an amplification system that provides gain to that input laser light. Optics and controller 375 represents the other optics that are desirable to route, condition, modulate, and otherwise function on the signal and/or pump light within system 370. In some embodiments, system output 377 includes signal laser light that was amplified or originated by gain portion 374. In other embodiments, system output 377 represents other output (such as, for example, paper printed by a laser printer or xerographic copier that forms system 370) that used signal laser light that was amplified or originated by gain portion 374. Thus, in various embodiments, system 370 represents an entire system (such as an aircraft, spacecraft, or ocean-going ship having a laser-ranging subsystem or other laser system) that includes a power supply 371 according to the present invention.

Figure 4:
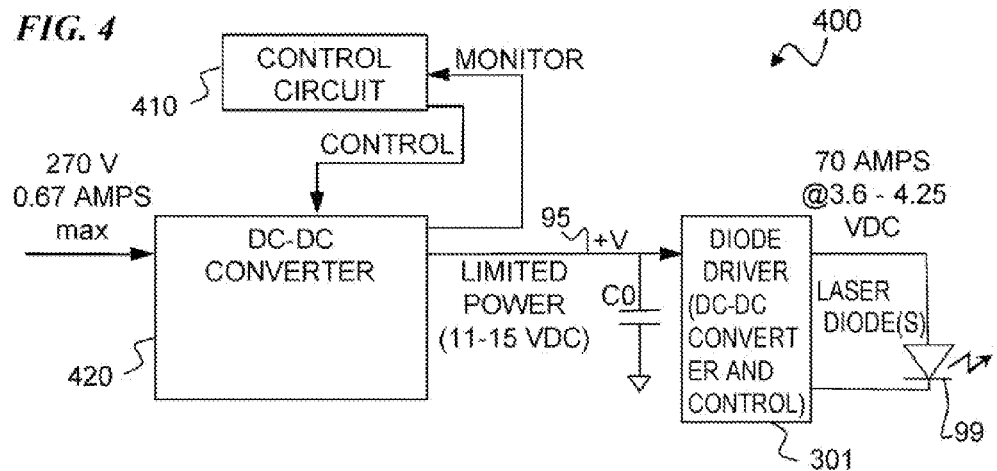
FIG. 4 is a block diagram of a switching power supply 400 that provides electrical power to a load, and that includes a plurality of DC-to-DC converters.

FIG. 3I is a timing diagram 390 schematically showing representative signals of a four-phase regulator system as used in some embodiments, as it turns the laser-diode current on and off. At T0, the ON/OFF control signal 395 goes from inactive (OFF) to active (ON). At T0$^+$, a very short time later (due to circuit delays, gate capacitance, and the like), all four PWM controllers cause their respective transistors to fully conduct (at or near a 100 percent duty cycle) and start current flow through their respective inductors, causing the output current $I_{DIODE}$ to rise according to the voltage-current-inductance relationship of each inductor L. In the graphs of FIG. 4, very brief negative-going pulses are shown in waveforms PWMφ$_1$ 391, PWMφ$_2$ 392, PWMφ$_3$394, and PWMφ$_4$395 in order to show the positions of the four phases of the clock; however some embodiments do not have these but rather continue to fully conduct until time T1. At time T1, the output current $I_{DIODE}$ 396 or 397 reaches its specified level (e.g., 70 amps), and this condition causes all four PWM controllers cause their respective transistors to conduct at a smaller duty cycle, i.e., that which is needed to maintain the desired output current, and at four different phases in order to reduce ripple in the output current. The phases of the pulse trains at this smaller duty cycle are offset one to another, in some embodiments, since the PWM circuits are driven at four different phases of a common input clock signal during the period between times T1 and T2. In some embodiments, a substantial portion of the input power or energy is stored on a capacitor (e.g., see FIG. 4 below) whose voltage (the input voltage to the laser-diode regulator system) will decrease as current is drawn from it, so as this input voltage decreases, the duty cycle of each of the four PWM circuits will automatically increase, as needed, in order to maintain the desired constant level through the laser diode load. The ripple in output current level shown during the period between times T1 and T2 is much greater than the actual ripple obtainable by some embodiments, in order to illustrate the concepts here. At T2, the ON/OFF control signal goes from active (ON) to inactive (OFF). At T2$^+$, a very short time later (due to circuit delays, gate capacitance, and the like), all four PWM controllers cause their respective transistors to fully stop conduction causing the output current $I_{DIODE}$ 396 or 397 to fall. In some embodiments that do not provide an SO or SS transistor switch, the output current $I_{DIODE}$ 396 falls according to the voltage-current-inductance relationship of each inductor L (and, in some embodiments that include a capacitance across the output load, the current fall slope is also influenced (extended) due to the charge on the capacitance flowing as current through the load). In other embodiments that do provide an SO and/or SS transistor switch, the output current $I_{DIODE}$ 397 falls according to switching characteristics of the SO and/or SS transistor switch, and the remaining charge on the capacitance or field in the inductor(s) is shorted or disconnected from the load, providing the much faster fall time in current curve 397.

FIG. 4 is a block diagram of a switching power supply 400 that provides electrical power to a load, and that includes a plurality of DC-to-DC converters. In some embodiments, two DC-to-DC converters are used in series. For example, in some embodiments, a second switching-mode DC-to-DC converter 420 has a relatively high-voltage moderate-current input (e.g., in some embodiments, 270 volts at 0.73 amps, 197 watts, or in other embodiments, any other suitable relatively high-voltage moderate-current power-supply input selected for the application such as, for example, about 100 volts, 133 volts, 167 volts, 200 volts, 233 volts, 267 volts, 300 volts, 333 volts, 367 volts, 400 volts, a voltage higher than 400 volts, or a voltage within a range bounded by any pair of the above voltages in combination with a current capability of about 0.25 amps, 0.5 amps, 0.75 amps, 1 amp, 1.25 amps, 1.5 amps, 1.75 amps, 2 amps, 2.25 amps, 2.5 amps, 2.75 amps, 3 amps, a current capability higher than about 3 amps, or a current capability within a range bounded by any pair of the above current capabilities) and, e.g., an intermediate output of 11 to 15 volts at 15 to 11 amps that is used to charge a suitably-sized intermediately located storage capacitor, and a second switching-mode DC-to-DC converter diode driver 301 (such as a combination of circuits 329, 320 and/or 327 shown in FIG. 3A forming diode driver 301) having one or more parallel circuits such as PWM constant-current controller 321 each having its respective Q1, L1, and D1.

In some embodiments, the second switching-mode DC-to-DC converter is output-voltage limited to not exceed 15 volts, and is output-current limited to supply a maximum current $I_{max} \leq C_1 + C_2(V_{max} - V_{out})$. The constants $C_1$ and $C_2$ are chosen to limit the maximum power drawn from the prime power supply, while nearly maximizing the current available to recharge the storage capacitor. In some embodiments, the first switching-mode DC-to-DC converter, i.e., diode driver 301, has a intermediate-voltage moderate current input (e.g., the output of the second DC-to-DC converter plus the current from the charged storage capacitor C0) and an output of 3.6 to 4.5 volts (suitable for a single laser diode or for laser diodes wired in parallel) at up to 100 amps or more (e.g., a constant current of 70 amps regardless of laser-diode voltage, in some embodiments) that is used to selectively drive the laser diode.

In other embodiments, the load includes two or more laser diodes wired in series, the intermediate voltage is set to a suitably higher voltage corresponding to, and higher than, the total voltage drop across the laser diodes.

In some embodiments, one particular application of the diode driver 301 described previously is the case in which the laser diode or diodes (the load) is/are to be operated intermittently, but the primary power source cannot supply the peak power required by the load. In such a case, energy must be accumulated and stored (for example, on a capacitor) during the "off" periods to supplement the supply current during the "on" periods. In some embodiments, the system is designed never to draw too much current from the primary power supply. Furthermore, although a large storage capacitor could be used to prevent voltage droop during operation, such a capacitor would be large and heavy, and thus undesirable in many applications. In some embodiments, a system is provided that utilizes the disclosed diode driver, avoids excessive current from the primary power source, and does not require a large capacitor. In some embodiments, three elements are included in this diode driver system, as shown in the block diagram, FIG. 4: DC-DC converter 420 that provides voltage step-down from a high input voltage. In one actual embodiment, the initial input supply can provide 270 volts DC at 0.73 Amps; control circuit 410 used to control the operating mode of the DC-DC converter is an "output power limited" supply (in one embodiment, the DC-DC converter 420 provides nominally 15 volts DC, but with a selectively limited output current; the maximum allowable output current depends upon the output voltage in order to maintain a substantially constant, limited output power); and the diode driver (e.g., 301 or 129 described previously) that provides energy storage and high current output (70 Amps) to generate the transient current waveform needed to drive diode lasers. In one embodiment, two laser diodes are driven at about, for example, a 25% duty factor for 10 seconds, with 30 seconds off, while in other embodiments, a selected number of laser diodes is driven using a selected duty factor of about 5%, 10%, 15%, 20%, 25%, 30%, 35%, 40%, 45%, 50%, 55%, 60%, 65%, 70%, 75%, 80%, 85%, 90%, 95% or other suitable selected duty factor within a range bounded by any selected pair of the above duty factors.

In one embodiment, the second power conversion stage 420 converts the 270 V line power to +15 volts DC. In some embodiments, this is done with, for example, a standard 15V, 250 W supply such as the standard Vicor Corporation's model V300B15C250B. Operation of the standard power supply can be modified or controlled with the control circuit 410 to make the output a constant-power supply, in the range of 11-15 volts DC. Operating the DC-DC converter unit 420 as a constant-power converter maximizes the available power to the diode driver, while not exceeding the input-line capacity of, for example, 197 watts.

The control circuit implements a control algorithm that includes two elements: first: Output-voltage limiting, such that the maximum voltage Vmax may not exceed 15 volts; and second: Output-current limiting, such that the maximum output current is restricted to $Imax \leq C1 + C2(Vmax - Vout)$. The constants C1 and C2 are chosen to limit the maximum power drawn from the prime power supply, while nearly maximizing the current available to recharge the storage capacitor in the diode driver. For example, with a primary power supply capable of delivering 0.73 Amps at 270 volts (197 Watts), and assuming a DC-DC converter efficiency of 87%, approximately 11 amps can be delivered at 15 V where Vout=Vmax (165 Watts delivered). The value of C1 is therefore 11 amps, in some embodiments. However, at Vout=11 volts, Imax can be about 15 amps. (In some embodiments, the highest power will actually be at 13 amps and 13 volts, for exactly 169 Watts.) The value of C2 is therefore 1 amp/volt, in some embodiments.

The laser drive, in some embodiments, requires a peak power that is higher than what is available from the 270-volt, 0.73-amp DC input. Increasing the size/capacity of the input power supply can be avoided for embodiments having a duty factor of less than 100%, since even though the power supply alone cannot supply the total or peak energy requirements during periods when the load (e.g., one or more laser diodes) is turned on, there is extra energy available during periods of time when the load is turned off. This extra energy is stored in capacitor at the +15 volts DC output of the DC-DC converter. The capacitance required to supply energy for the peak load is minimized by the diode driver design described earlier. The diode driver can tolerate significant droop on its +15 volts DC input with substantially no degradation to its output capacity. The diode driver has substantially no output capacitance. In some embodiments, cable (e.g., coaxial cable) used to conduct current to laser diode 99 has inherent inductance, which does not cause ringing or overshoot in the load, but acts as additional filtering to reduce ripple current. In total, this design provides small size by minimizing required energy storage capacitance, and has high efficiency to meet the output requirement without exceeding the input power limit.

Figure 5:
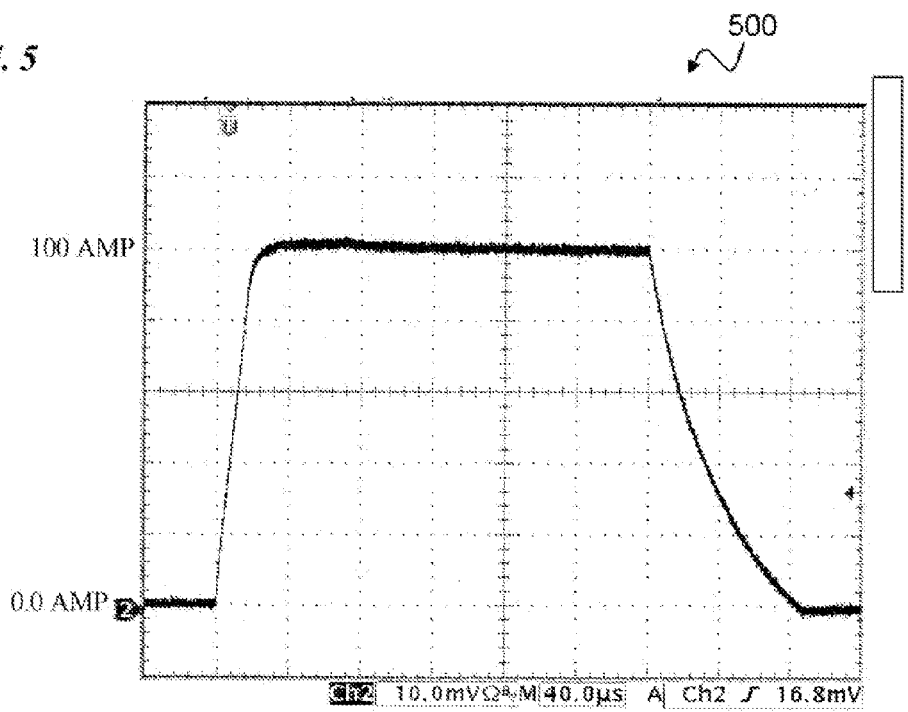
FIG. 5 is an oscilloscope graph of current vs. time for one embodiment of the present invention uses a plurality of DC-to-DC converters.

FIG. 5 is an oscilloscope graph of current vs. time for one embodiment of the present invention uses a plurality of DC-to-DC converters. A measured current output waveform for one such diode driver shown above is presented in FIG. 5, illustrating a 20-microsec current rise. The fall time is extended due to the operating mode selected for this test. The driver can be setup to provide 20- to 30-microsec fall time. As described above, with an OFF switch such as transistor Q0 of FIG. 3A (or transistors QO1-QOn of FIG. 3B or FIG. 3C), some embodiments of the invention provide a fall time of 1-2 microseconds or faster. In the embodiment shown, the peak current is 100 Amps (20 A/div) and the pulse width is approximately 200 microseconds (40 microseconds/div). The current waveform is measured at an ambient temperature of 20 degrees C. In some embodiments, no current overshoot is observed and no negative bias of the laser diode was measured on the trailing edge of the pulse.

In some embodiments, the present invention provides an apparatus that includes a first DC-to-DC converter having one or more voltage-step-down circuits, each voltage step-down circuit operatively coupled to apply a duty-cycle-modulated pulse train through an inductor to an output to control a value of a current through a load, wherein there is substantially no capacitance at the first DC-to-DC converter's output.

In some embodiments of the apparatus, each voltage step-down circuit further includes a first switch transistor and a diode, the transistor turning on and off and coupled to provide a switched current path for inductor current as controlled by the pulse train, and the diode coupled to provide a current path for the inductor that conducts only when the transistor is off.

In some embodiments of the apparatus, each voltage step-down circuit further includes a first switch transistor and a second switch transistor, the first transistor turning on and off and coupled to provide a switched current path for inductor current as controlled by the pulse train, and the second transistor coupled to provide a current path for the inductor that conducts only when the first transistor is off.

In some embodiments of the apparatus, the load is connected between a first supply voltage and a first node of the inductor of each one of the one or more voltage-step-down circuits, and in each of the one or more voltage-step-down circuits the diode is connected between a second node of the inductor and the first supply voltage and the transistor is connected to switchedly conduct current between the second node of the inductor and a second voltage supply.

In some embodiments of the apparatus, the first supply voltage is a positive voltage and the second voltage supply is ground.

Some embodiments of the apparatus further include a laser diode, wherein the load includes the laser diode.

In some embodiments of the apparatus, at least one of the one or more voltage-step-down circuits further includes a pulse-width modulation controller, wherein the duty-cycle-modulated pulse train is a pulse-width modulated output of the pulse-width modulation controller that controls conduction through the transistor.

Some embodiments of the apparatus further include an on-off controller coupled to provide on-off control to each one of the one or more voltage-step-down circuits.

Some embodiments of the apparatus further include an overcurrent-prevention circuit coupled to stop current through the laser diode (for example, by disconnecting power, disconnecting the load, or shorting the load) if an overcurrent condition is detected.

In some embodiments of the apparatus, the first DC-to-DC converter includes two or more of the voltage-step-down circuits wired in parallel and each is driven by different phases of a clock signal.

Some embodiments of the apparatus further include a second DC-to-DC converter having a voltage-step-down circuit coupled to receive a high-voltage low current input and to generate an intermediate voltage intermediate-current output that is operatively coupled to charge a first capacitance, and wherein the first DC-to-DC converter is coupled to receive current from the second DC-to-DC converter and the first capacitance in parallel.

Another aspect of some embodiments of the invention provides a method that includes selectively applying a first pulse train through a first inductance to an output to supply a current through a load, wherein there is substantially no capacitance at the output; and modulating a duty cycle of the pulse train to control a value of the current through the load, wherein the load includes a first laser diode.

Some embodiments of the method further include providing switch transistor and a diode; controlling the transistor to turn on and off; coupling the transistor to provide a switched current path for inductance current as controlled by the pulse train; and coupling the diode to provide a current path for the inductance that conducts only when the transistor is off.

Some embodiments of the method further include connecting the load between a first supply voltage and a first node of the inductance; connecting the diode between a second node of the inductance and the first supply voltage; and connecting the transistor to switchedly conduct current between the second node of the inductance and a second voltage supply.

In some embodiments of the method, the first supply voltage is a positive voltage and the second voltage supply is ground.

In some embodiments of the method, the load further includes a second laser diode.

In some embodiments of the method, the modulating of the duty cycle further includes modulating a pulse-width of the pulse train, and wherein the duty-cycle-modulated pulse train is a pulse-width modulated output of the pulse-width modulation controller that controls conduction through the transistor.

Some embodiments of the method further include controlling an on-off characteristic to provide on-off control to each one of the one or more voltage-step-down circuits.

Some embodiments of the method further include controlling an on-off characteristic to provide an overcurrent-prevention that stops current through the laser diode if an overcurrent condition is detected.

Some embodiments of the method further include selectively applying a second pulse train through a second inductance to an output to supply a current through the load, wherein the first and second inductance deliver current in parallel and each are driven by different phases of a clock signal.

Some embodiments of the method further include providing a second DC-to-DC converter having a voltage-step-down circuit coupled to receive a high-voltage low current input and to generate an intermediate voltage intermediate-current output that provides a source of current through the load.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An apparatus comprising:
a first DC-to-DC converter having one or more voltage-step-down circuits, each voltage step-down circuit operatively coupled to apply a duty-cycle-modulated pulse train through an inductor to an output to control a value of a current through a load, wherein there is no capacitor at the first DC-to-DC converter's output, and wherein the first DC-to-DC converter is configured to provide a plurality of different controlled non-zero current values over a plurality of consecutive time periods including a first non-zero current value at a first time period and a second non-zero current value at a second time period that follows consecutively after the first time period.

2. The apparatus of claim 1, wherein the one or more voltage-step-down circuits includes a plurality of voltage-step-down circuits including a first voltage-step-down circuit and a second voltage-step-down circuit, wherein the first DC-to-DC converter further comprises a pulse-width modulation controller, wherein the duty-cycle-modulated pulse train is a pulse-width modulated output of the pulse-width modulation controller, wherein the pulse-width modulated output includes a plurality of pulses including a first pulse that has a first start time and a first end time operatively coupled to the first voltage-step-down circuit and a second pulse that has a second start time and a second end time operatively coupled to the second voltage-step-down circuit, wherein the second start time of the second pulse occurs after the first start time of the first pulse and before the first end time of the first pulse, and wherein the second end time of the second pulse occurs after the first end time of the first pulse.

3. The apparatus of claim 1, wherein at least one of the one or more voltage-step-down circuits further comprises an electronically switchable electronic circuit that selectively connects a first node of the inductor alternately to a first supply voltage and to a second supply voltage.

4. The apparatus of claim 3, wherein each one of the one or more voltage step-down circuits further comprises a first transistor and a diode, and wherein the electronically switchable electronic circuit includes the first transistor as a single-pole single-throw switch.

5. The apparatus of claim 1, wherein at least one of the one or more voltage-step-down circuits further comprises a single-pole double-throw switch.

6. The apparatus of claim 1, wherein at least one of the one or more voltage-step-down circuits further comprises a first N channel MOSFET and a second complementary P-channel MOSFET, the first N channel MOSFET alternately turning substantially on and substantially off and coupled to provide a switched current path for inductor current as controlled by the pulse train, and the second complementary P-channel MOSFET coupled to provide a current path for the inductor that substantially conducts only when the first transistor is off.

7. The apparatus of claim 1, wherein at least one of the one or more voltage-step-down circuits further comprises a first N-channel transistor and a second N-channel transistor.

8. An apparatus comprising:
a first inductance having a first output;
a second inductance having a second output; and
means for selectively supplying a plurality of different controlled non-zero current values through a load over a plurality of consecutive time periods including a first non-zero current value at a first time period and a second non-zero current value at a second time period that follows consecutively after the first time period, wherein the selectively supplying further comprises:
means for selectively applying a first pulse train through the first inductance to the first output to supply the first current value through a common output to the load,
means for selectively applying a second pulse train through the second inductance to the second output to supply the first current value through the common output to the load, and
means for modulating a duty cycle of the first pulse train and means for modulating a duty cycle of the second pulse train to control the first current value through the common output to the load, wherein there is no capacitor at the common output to the load.

9. The apparatus of claim 8, wherein the means for modulating the duty cycle of the first pulse train includes means for pulse-width modulating the first pulse train such that the first pulse train includes a plurality of pulses including a first pulse that has a first start time and a first end time and a second pulse that has a second start time and a second end time, wherein the second start time of the second pulse occurs after the first start time of the first pulse and before the first end time of the first pulse, and wherein the second end time of the second pulse occurs after the first end time of the first pulse.

10. The apparatus of claim 8, further comprising means for selectively connecting a first node of the first inductance alternately to a first supply voltage and to a second supply voltage.

11. The apparatus of claim 8, further comprising means for phase shifting the first and second pulse trains by different amounts to reduce ripple in the common output to the load.

12. The apparatus of claim 8, wherein the means for selectively applying the first pulse train includes N-channel transistor means for selectively applying the first pulse train.

13. The apparatus of claim 8, wherein the means for selectively applying the first pulse train includes complementary MOSFET means for selectively applying the first pulse train.

14. The apparatus of claim 1, wherein the one or more voltage-step-down circuits includes a plurality of voltage-step-down circuits including a first voltage-step-down circuit and a second voltage-step-down circuit, wherein the first voltage-step-down circuit includes a first serially coupled transistor operatively coupled to substantially stop current flow between the first voltage-step-down circuit and the load, and wherein the second voltage-step-down circuit includes a second serially coupled transistor operatively coupled to substantially stop current flow between the second voltage-step-down circuit and the load.

15. An apparatus comprising:
a first DC-to-DC converter having a plurality of voltage-step-down circuits including a first voltage-step-down circuit and a second voltage-step-down circuit, wherein each one of the plurality of voltage step-down circuits is operatively coupled to apply a duty-cycle-modulated pulse train through an inductor to a first output node, wherein the first DC-to-DC converter controls a value of a current through a load, wherein there is no capacitor at the first DC-to-DC converter's first output node, and wherein the first DC-to-DC converter is configured to control the value of the current through the load to be one of a plurality of different controlled non-zero current values over a plurality of consecutive time periods including a first non-zero current value at a first time period and a second non-zero current value at a second time period that follows consecutively after the first time period.

16. The apparatus of claim 15, wherein the first voltage-step-down circuit and the second voltage-step-down circuit each includes an electronically switchable electronic circuit that selectively connects a first node of the inductor alternately to a first supply voltage and to a second supply voltage.

17. The apparatus of claim 16, wherein the first voltage-step-down circuit and the second voltage-step-down circuit each includes a first transistor and a diode, and wherein the electronically switchable electronic circuit includes the first transistor as a single-pole single-throw switch.

18. The apparatus of claim 15, wherein the first DC-to-DC converter further includes a transistor connected in parallel across the load that selectively shorts across the load in order to have a faster turn off of the load.

19. The apparatus of claim 15, wherein at least one of the one or more voltage-step-down circuits further comprises an N-channel MOSFET and a P-channel MOSFET, the N-channel MOSFET alternately turning substantially on and substantially off and coupled to provide a switched current path for inductor current as controlled by the pulse train, and the P-channel MOSFET coupled to provide a current path for the inductor that substantially conducts only when the first transistor is off.

20. The apparatus of claim 15, wherein at least one of the one or more voltage-step-down circuits further comprises a first N-channel transistor and a second N-channel transistor.

* * * * *